(12) United States Patent
Ohtani et al.

(10) Patent No.: US 6,377,468 B1
(45) Date of Patent: Apr. 23, 2002

(54) ELECTRIC CIRCUIT APPARATUS

(75) Inventors: Hideyuki Ohtani, Aichi-gun; Fukuo Ishikawa, Kariya; Hideki Kabune, Chiryu; Hiroshi Hattori, Handa, all of (JP)

(73) Assignees: ANDEN Co., Ltd., Anjo; DENSO Corporation, Kariya, both of (JP)

( * ) Notice: Subject to any disclaimer, the term of this patent is extended or adjusted under 35 U.S.C. 154(b) by 0 days.

(21) Appl. No.: 09/593,862

(22) Filed: Jun. 15, 2000

(30) Foreign Application Priority Data

Jun. 18, 1999 (JP) .......................... 11-172004
Apr. 11, 2000 (JP) .......................... 12-109632

(51) Int. Cl.[7] ................................ H05K 7/02
(52) U.S. Cl. ................ 361/783; 361/760; 361/761; 361/807; 361/743; 361/820; 29/840; 257/691; 228/180.21; 228/179.1
(58) Field of Search .................. 361/783, 760, 361/761, 807, 808, 809, 820, 743, 771; 29/840; 257/691; 228/180.21, 179.1

(56) References Cited

U.S. PATENT DOCUMENTS 5,849,606 A * 12/1998 Kikuchi et al. ............. 438/108

FOREIGN PATENT DOCUMENTS

JP 2-288292 11/1990
JP 10-200292 7/1998

* cited by examiner

Primary Examiner—Jayprakash N. Gandhi
Assistant Examiner—Thanh Y. Tran
(74) Attorney, Agent, or Firm—Law Offices of David G. Posz

(57) ABSTRACT

Circuit elements of surface-mounting type such as MOSFETs etc. are mounted on a circuit board by soldering. The circuit board is retained slantingly by a base so that any one of the MOSFET falls out by its self-weight when the solder melts due to an abnormal heat generation of the MOSFET. The falling of the MOSFET is stopped by a stopper member, and then the MOSFET becomes in an electrically open state and retained at the stopped position in consequence of the subsequent cooling of the solder. Accordingly, even if one or more of the MOSFETs cause the abnormal heat generation, the continuous heat generation of the MOSFET is stopped and also the other circuit elements are prevented from being short-circuited.

8 Claims, 7 Drawing Sheets

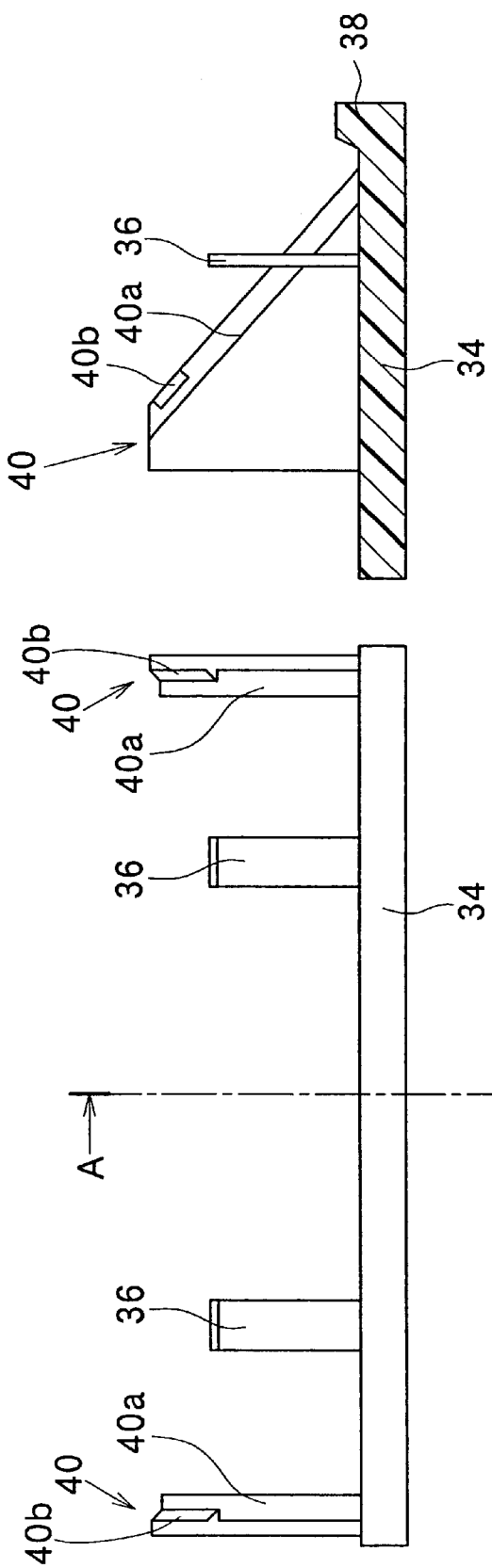

ELECTRIC CIRCUIT APPARATUS

BACKGROUND OF THE INVENTION

The present invention relates to an electric circuit apparatus wherein semiconductor power devices of surface-mounting type are mounted on a circuit board by soldering.

Conventionally there exist an electric circuit apparatus wherein a plurality of circuit elements of surface-mounting type such as semiconductor power devices, electrolytic capacitors, resistors, etc. are surface-mounted on a circuit board by soldering.

In the conventional electric circuit apparatus, the circuit board is arranged in a vertical direction (in a direction of gravity) or in a horizontal direction. Therefore, when the semiconductor power device causes abnormal heat generation by a malfunction etc., the following problem occurs. That is, in case of the circuit board arranged in a vertical direction, the semiconductor power device drops when the solder melts by the abnormal heat generation of the semiconductor power device and is left in a casing of the electric circuit apparatus. Since the semiconductor power device of surface-mounting type has a planar back electrode formed on its back, if the semiconductor power device moves from its original position due to the influence of vibration etc., it is likely to cause problems such as short-circuiting of other circuit elements, and the like. On the other hand, in case of the circuit board arranged in a horizontal direction, the semiconductor power device does not drop when the solder melts by the abnormal heat generation of the semiconductor power device, but its abnormal heat generation continues and this may exert a bad influence on the other circuit elements.

SUMMARY OF THE INVENTION

It is the object of the present invention to provide an improved electric circuit apparatus wherein semiconductor power devices of surface-mounting type are mounted on a circuit board by soldering.

It is the object of the present invention to prevent continuous heat generation of the semiconductor power device and also prevent other circuit elements from being short-circuited in the event of the solder melting due to the abnormal heat generation of the semiconductor power device.

According to the present invention, the electric circuit apparatus is slantingly disposed so that the semiconductor power device falls out by its self-weight when the solder melts due to the heat generation of the semiconductor power device. The semiconductor power device is stopped by a stopper member and becomes in an electrically open state at the stopped position. Therefore, the continuous heat generation of the semiconductor power device is stopped.

The semiconductor power device is retained at the stopped position in consequence of the subsequent cooling of the solder. Therefore, the other circuit elements are prevented from being short-circuited.

The electric circuit apparatus preferably has a retention member for slantingly retaining the circuit board so that a semiconductor power device falls out by its self-weight. The retention member and the stopper member may be configured to be a single member.

The back electrode of the semiconductor power device may be partially fixed to the first electrode pad in consequence of the subsequent cooling of the solder so that the semiconductor power device is surely retained at the stopped position.

The other electrode terminal of the semiconductor power device may be soldered to the second electrode pad which is located at the opposite side of the stopper member with respect to the first electrode pad in an inclination direction of the circuit board so that the semiconductor power device surely becomes in an electrically open state when the semiconductor power device falls out.

In case where a plurality of semiconductor power devices are mounted on the circuit board, a plurality of stopper members may be provided to stop the falling of the respective semiconductor power devices. Alternatively a single stopper member may be provided to stop the falling of the respective semiconductor power devices. In the latter case, preferably, the other circuit elements may be positioned at a higher location than the plurality of semiconductor power devices.

BRIEF DESCRIPTION OF THE DRAWINGS

FIG. 3A shows a front view of a base.

FIG. 3B shows a cross section of the base along with the A—A section line of FIG. 3A.

DETAILED DESCRIPTION OF THE PREFERRED EMBODIMENTS

Figure 1:
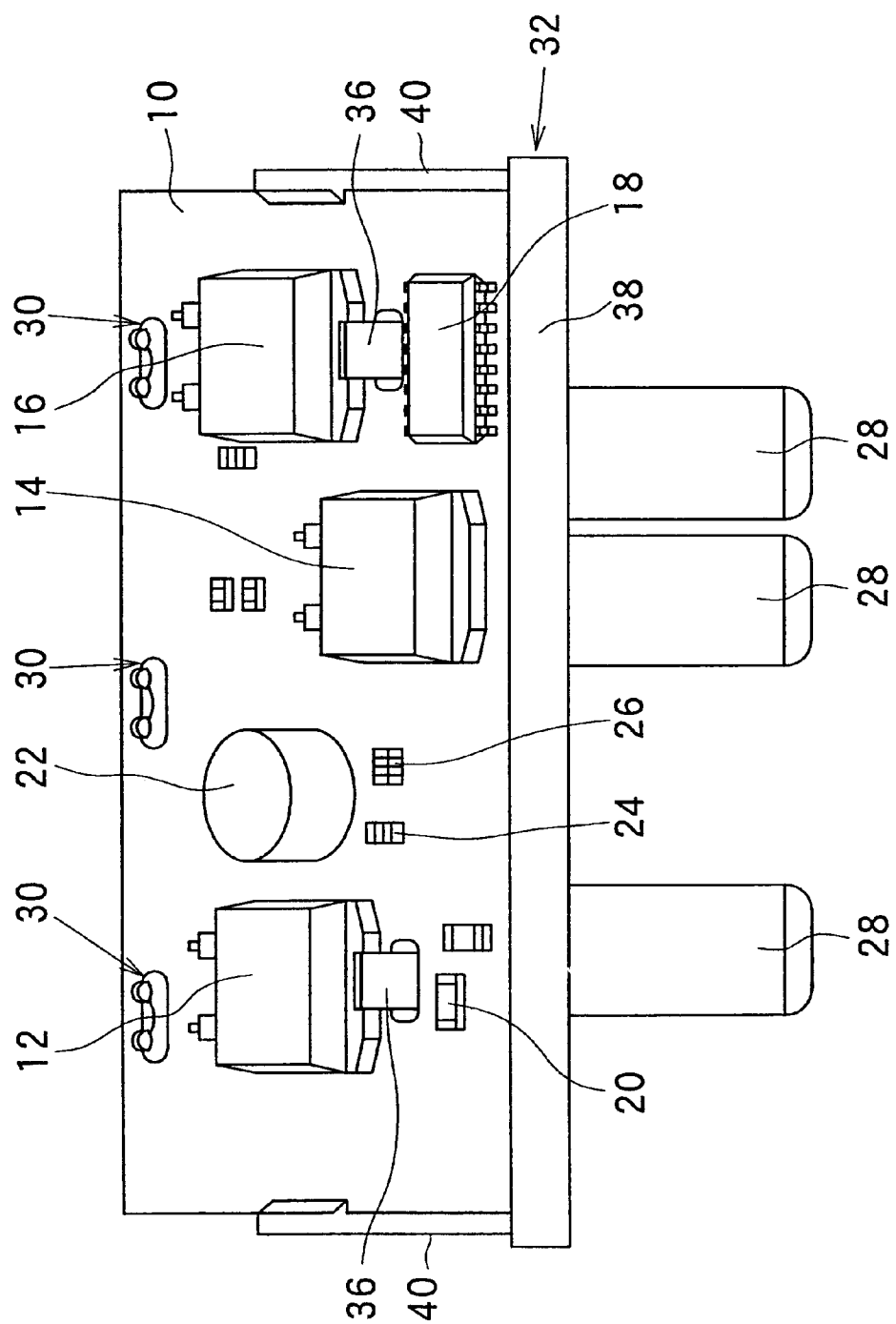
FIG. 1 shows a front view of the electric circuit apparatus according to the present invention.

The electric circuit apparatus shown in FIG. 1 is used for a driving device for driving loads such as lamps or motors of a vehicle. In FIG. 1, a plurality of circuit elements of surface-mounting type are surface-mounted on the top surface of a circuit board 10 by soldering. Specifically, circuit elements such as MOSFETS 12, 14, 16, an IC 18, a resistor 20, an electrolytic capacitor 22, capacitors 24, 26, etc. are mounted on the top surface of the circuit board 10.

On the top surface of the circuit board 10, formed are electrode pads which are electrically connected to these circuit elements as well as wiring. The circuit board 10 is arranged to be electrically connected to the outside via metal terminals 28. Each of the terminal 28 passes through a through hole formed on the circuit board 10 and soldered to each of the terminal connection parts 30, so as to be electrically connected to the wiring formed on the top surface of the circuit board 10. On the circuit board 10, formed are through holes for passing through first stopper members 36, respectively.

Figure 2:
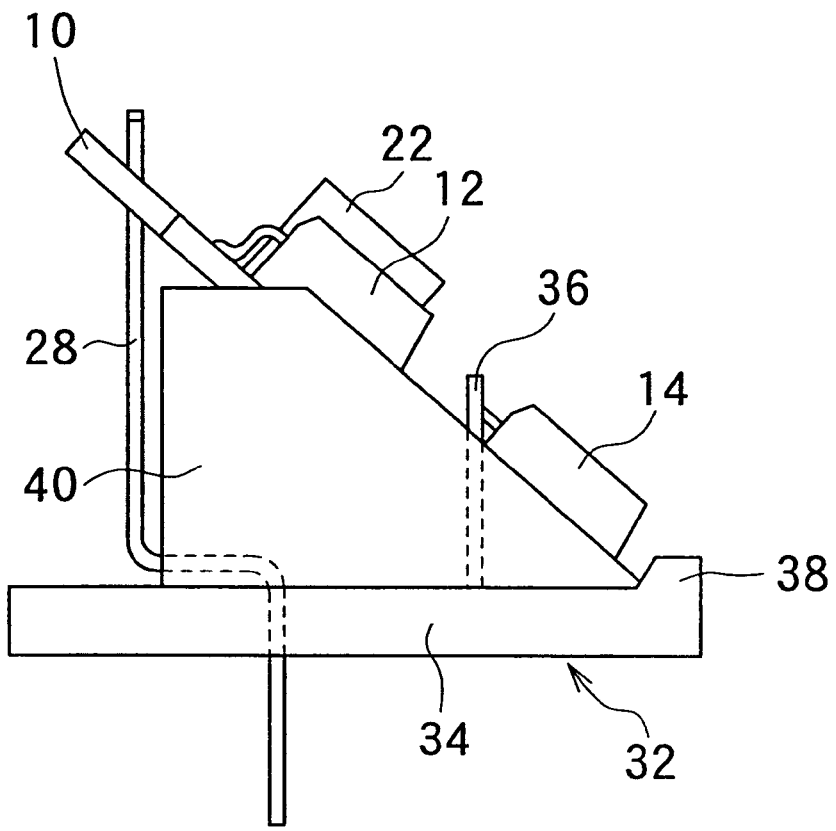
FIG. 2 shows a side view of the electric circuit apparatus shown in FIG. 1 from the left side.

The circuit board 10 is retained slantingly by means of the base 32 serving as a retaining member, as shown in FIGS. 1 and 2. The detailed structure of the base 32 is shown in FIG. 3. The base 32 comprises a planar bottom 34, first and second stopper members 36, 38, and sidewalls 40 provided on both sides of the bottom 34, all of which are made of resin as a single integrated unit. Through holes for passing terminals 28 are formed respectively at the bottom 34. Board receiving parts 40a and claws 40b for fixing a circuit board are formed at both of the sidewalls 40.

The circuit board 10 is fixed to the base 32 by passing each of the terminals 28 through each of the through holes formed in the bottom 34, passing each of first stopper members 36 through each of the through holes formed in the circuit board 10, then pressing both left and right sides of the circuit board 10 against the board receiving parts 40a, and retaining the circuit board 10 with the claws 40b. In this condition, the circuit board 10 is fixed slantingly with an inclination of a predetermined angle to the base 32. The inclination angle is preferably between 30 degrees and 60 degrees. The electric circuit apparatus is installed in an appropriate place inside of a vehicle so that the bottom 34 of the base 32 is horizontally disposed.

In case where any one of the MOSFETs 12, 14, 16 causes the abnormal heat generation and the solder for fixing the MOSFET melts, the MOSFET can be allowed to fall out by its self-weight.

The first and second stopper members 36, 38 are provided to stop any one of the MOSFETs 12, 14, 16 at predetermined positions when it falls out. Specifically, the first stopper members 36 are provided to stop either the MOSFET 12 or the MOSFET 16 when it falls out and the second stopper member 38 is provided to stop the MOSFET 14 when it falls out. In a condition when the MOSFET is stopped by the stopper member, the MOSFET becomes in an electrically open state and the abnormal heat generation becomes ceased. By the subsequent natural cooling of the solder, the MOSFET is retained as being stopped by the stopper member. This mechanism will be described hereinafter taking the MOSFET 14 as an example.

Figure 4B:
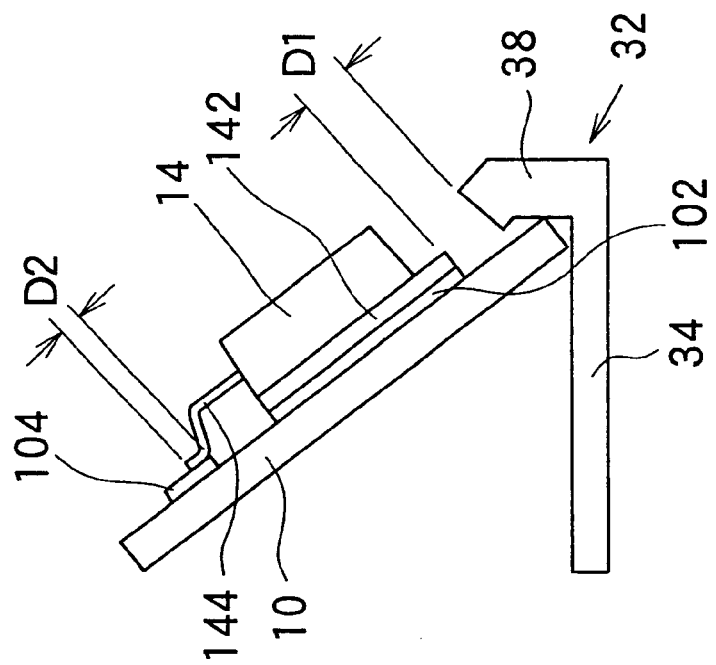
FIG. 4B shows a schematic side view of a part of the circuit board on which the MOSFET is mounted.
Figure 4A:
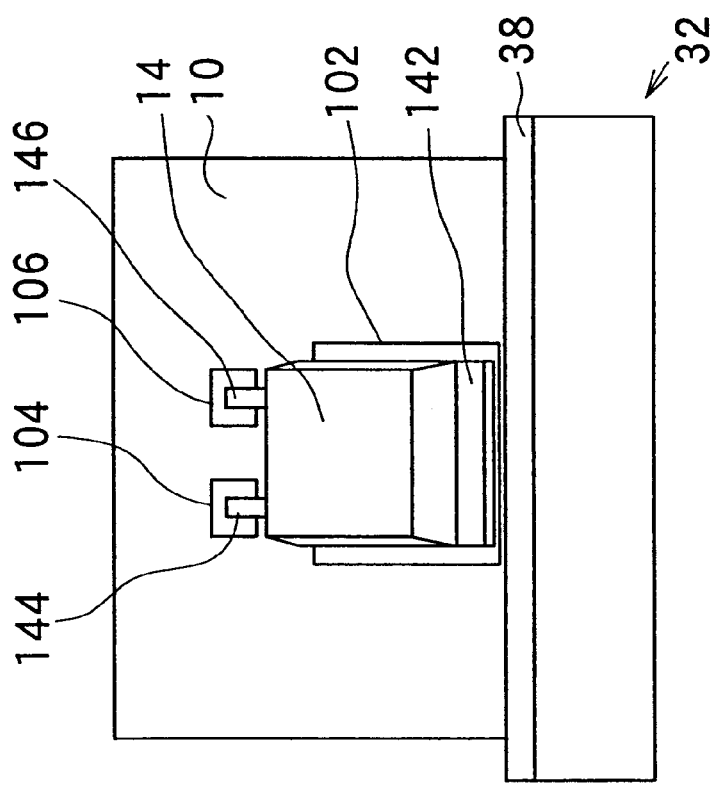
FIG. 4A shows a schematic front view of a part of the circuit board on which the MOSFET is mounted.

As shown in FIGS. 4A and 4B, a planar drain electrode 142 which also serves as a heat sink is formed as a back electrode on a back of the MOSFET 14. The drain electrode 142 is soldered to a drain pad (an electrode pad for the drain) 102 formed on the top surface of the circuit board 10. A gate electrode terminal 146 and a source electrode terminal 144 of the MOSFET 14 are soldered to a gate pad (an electrode pad for the gate) 106 and a source pad (an electrode pad for the source) 104, respectively. Both of the gate pad 106 and the source pad 104 are formed to be at a higher location than the MOSFET 14 (namely, at an opposite side of the second stopper member 38 with respect to the drain pad 102 in the inclination direction of the circuit board 10). As shown in FIG. 4B, the distance D1 between the drain electrode 142 and the second stopper member 38 is set to be longer than an overlapping length D2 where the source pad 104 and the source electrode terminal 144 overlap. This is the same as an overlapping length where the gate pad 106 and the gate electrode terminal 146 overlap.

Figure 5B:
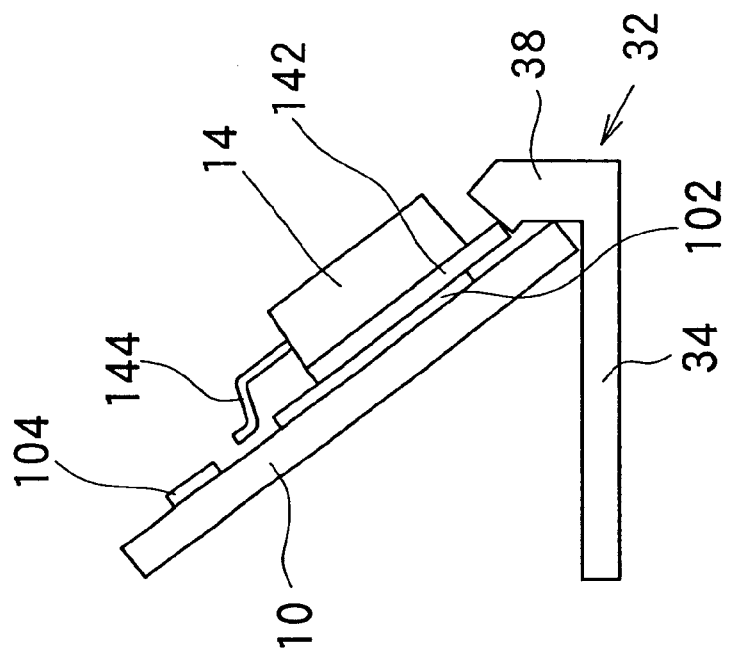
FIG. 5B shows a schematic side view of a part of the circuit board in a condition when the solder melted due to the abnormal heat generation of the MOSFET and the MOSFET fell out.
Figure 5A:
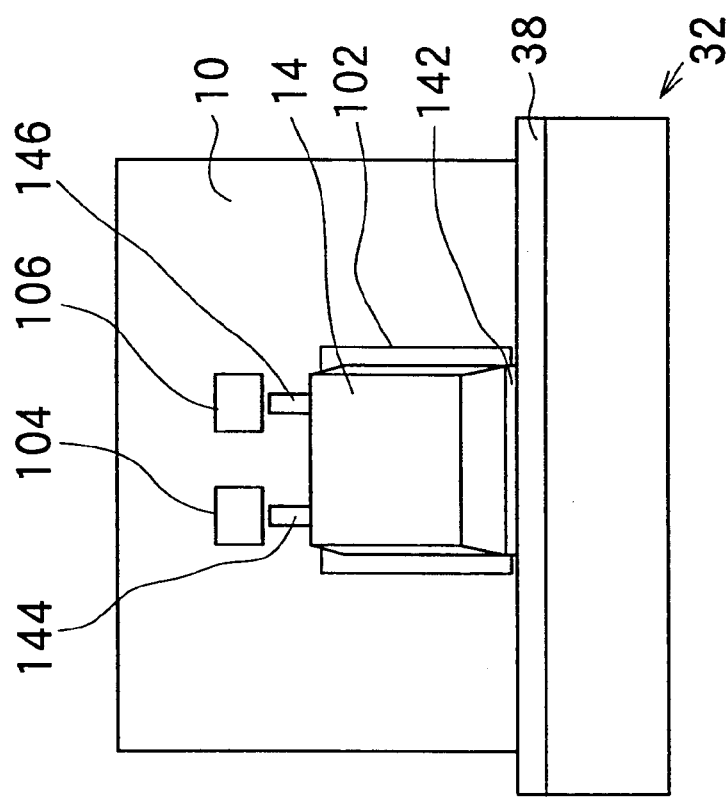
FIG. 5A shows a schematic front view of a part of the circuit board in a condition when the solder melted due to the abnormal heat generation of the MOSFET and the MOSFET fell out.

When the MOSFET 14 causes the abnormal heat generation to effect the melting of the solder between the drain electrode 142 and the drain pad 102, between the gate electrode terminal 146 and the gate pad 106, and between the source electrode terminal 144 and the source pad 104, respectively, the MOSFET 14 falls out by its self-weight and moves by a distance of the above-mentioned length D1, and is stopped by the second stopper member 38. FIG. 5 shows the condition at this moment. In this condition, as shown in FIG. 4, since the distance D1 and distance D2 are set to satisfy a formula: D1>D2, the gate electrode terminal 146 and the source electrode terminal 144 of the MOSFET 14 are located between the drain pad 102 and the gate pad 106 and between the drain pad 102 and the source pad 104, respectively, so that the MOSFET 14 becomes in an electrically open state.

Figure 6A:
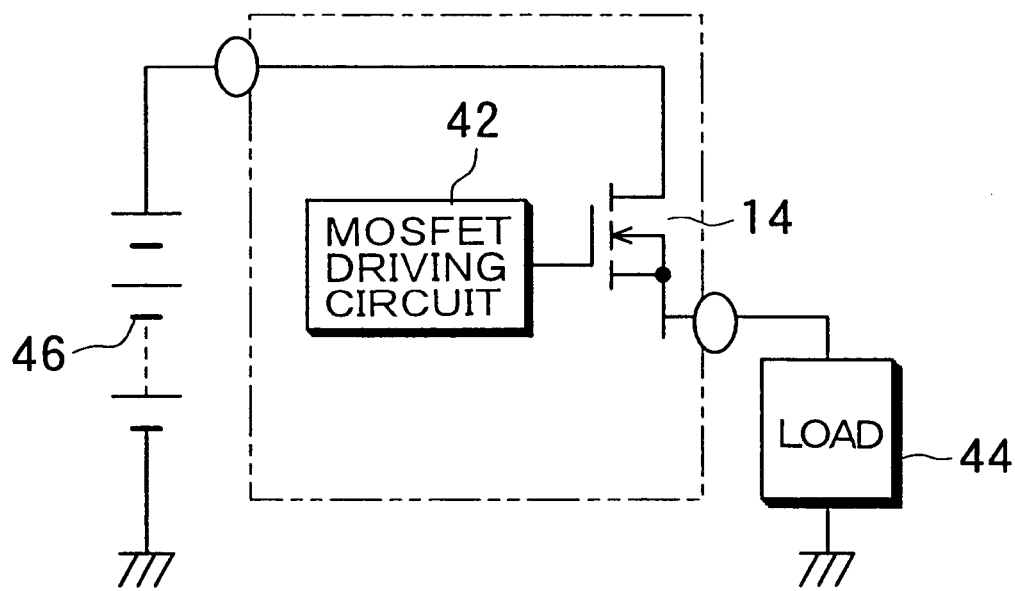
FIG. 6A shows an electric circuit diagram before the MOSFET falls out.
Figure 6B:
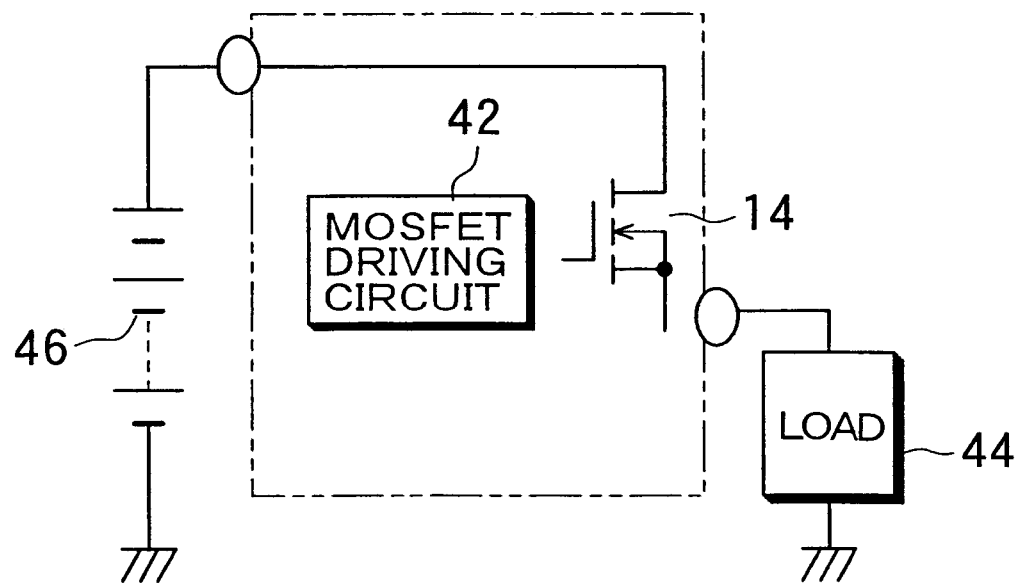
FIG. 6B shows an electric circuit diagram after the MOSFET fell out.

In this case, the electric circuit changes from a state before the abnormal heat generation shown in FIG. 6A to a state shown in FIG. 6B. The electrical continuity between the gate of the MOSFET 14 and the MOSFET driving circuit 42 is opened and also electrical continuity between the drain of the MOSFET 14 and the load 44 is also opened. Therefore, the flow of electricity from a battery 46 to the MOSFET 14 is blocked, accordingly the abnormal heat generation of the MOSFET 14 is stopped.

On the other hand, as shown in FIG. 5, in a condition when the MOSFET 14 is stopped by the second stopper member 38, the drain electrode 142 of the MOSFET 14 is located at a position where the drain pad 102 overlaps the drain electrode 142 partially, so that the drain electrode 142 is partially fixed to the electrode for a drain 102 by the natural cooling of the solder subsequent to stopping of the abnormal heat generation. In this way, by fixing the MOSFET 14 at the stopped position set by the second stopper member 38, the fallen MOSFET 14 is prevented from moving in a casing (not shown in the drawing) of the electric circuit apparatus, so that the additional problems such as short-circuiting of the other circuits etc. do not occur.

In the foregoing, taking the MOSFET 14 as an example, described is the operation of the electric circuit apparatus when the abnormal heat generation occurs. Also in other MOSFETs 12 and 16, the same operation is performed, that is, falling of the MOSFET, stopping of the fallen MOSFET by the stopper member, and retaining of the fallen MOSFET at the stopped position in consequence of the subsequent cooling of the solder. In this case, each of the MOSFETs 12, 16 is stopped at a position of each of the first stopper members 36.

Figure 7:
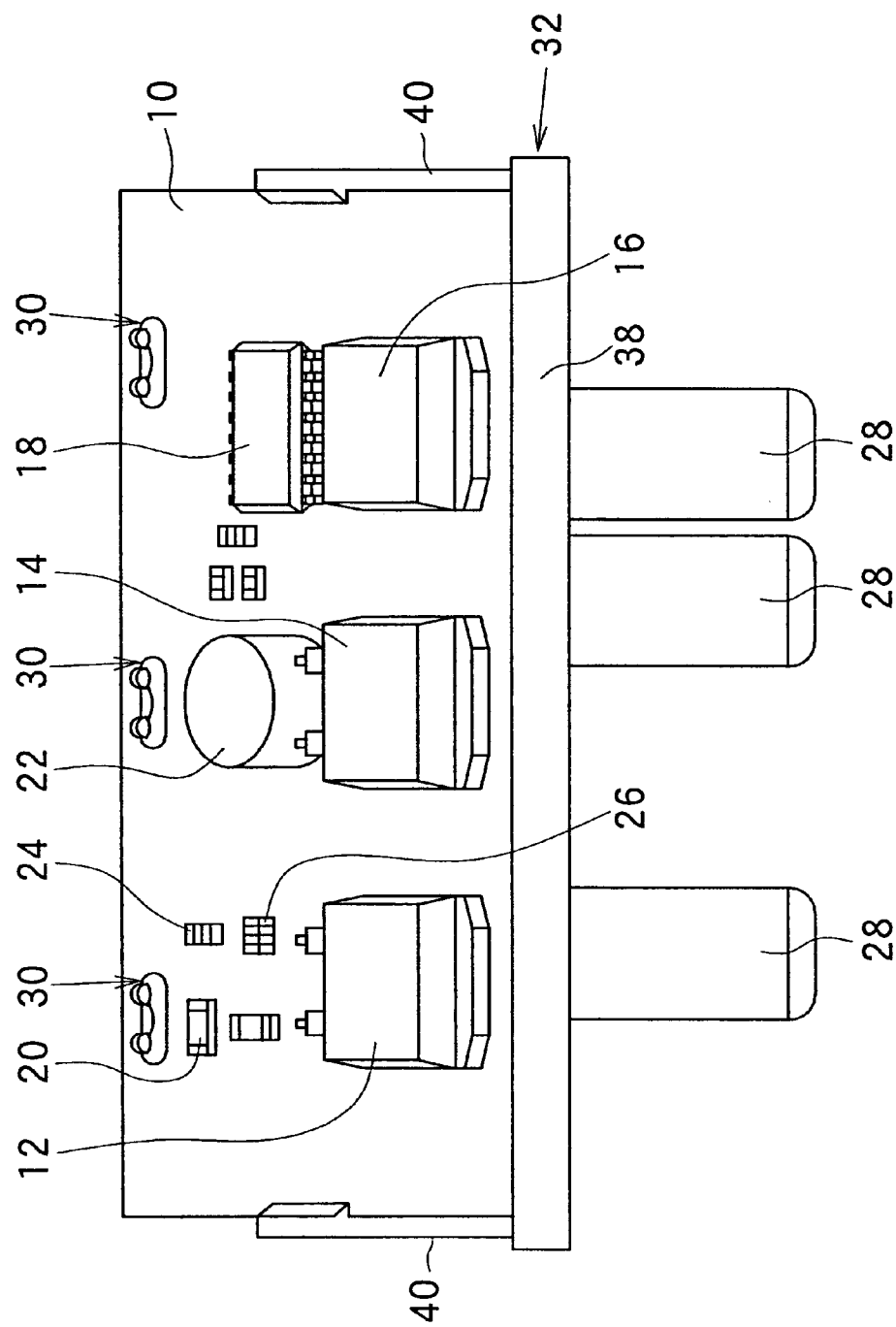
FIG. 7 shows a front view of the other electric circuit apparatus according to the present invention.

In the above-described embodiment, as shown in FIG. 1, the resistor 20, the electrolyte capacitor 22, the capacitors 24, 26, the IC 18, etc. exist at the same height of or below the MOSFETs 12, 14, 16 which are to be fallen in the event of a malfunction and the MOSFETs 12, 16 are intended to be stopped by the first stopper members 36. However, in a case of the first stopper members 36 shaped as depicted in FIG. 1, there is a possibility that the MOSFETs 12, 16 may fall aside. To avoid this behavior, it may be preferable to adopt a design where compartment walls (protrusions) are provided at both sides of each of MOSFETs 12, 16 so that the MOSFETs 12, 16 are prevented from falling aside. Alternatively, as shown in FIG. 7, it may also be preferable to adopt other configuration where all of the MOSFETs 12, 14, 16 which are to be fallen in the event of a malfunction are positioned in the closest vicinity to the stopper member 38, hence the first stopper members 36 is eliminated, and the resistor 20, the electrolyte capacitor 22, the capacitors 24, 26, the IC 18, etc. are positioned at a higher location than the MOSFETs 12, 14, 16. In this case, it is not necessary, that all of the circuit elements except the MOSFETs 12, 14, 16 are positioned at a higher location than the MOSFETs 12, 14, 16, but any circuit element which will not be affected by the fallen MOSFET may be located at the same height as the MOSFETs 12, 14, 16.

In addition, it is needless to say that circuit elements to be mounted on the circuit board 10 are not limited to those shown in FIGS. 1 and 7, but a variety of circuit elements necessary to construct an electric circuit apparatus may be mounted thereon.

Moreover, in the above-described embodiment, the first and second stopper members 36, 38 are fabricated as a single integrated unit together with the base 32 for retaining the circuit board 10, but these members may be provided separately on the top surface of the circuit board 10, setting the base 32 individual.

Moreover, in the above-described embodiment, the MOSFETs are used as semiconductor power devices, but the present invention can also be applied to an electric circuit apparatus where other semiconductor power devices such as bipolar transistors, IGBTs (Insulated Gate Bipolar Transistors), etc. are used.

A number of embodiments of the present invention have been described. Nevertheless, it will be understood that various modification may be made without departing from the spirit and scope of the invention. Accordingly, other embodiments are within scope of the following claims.

What is claimed is:

1. An electric circuit apparatus, comprising:

a circuit board; and at least one semiconductor power device of surface-mounting type mounted on said circuit board by soldering;

wherein said circuit board is disposed slantingly so that said semiconductor power devices falls out by its self-weight when the solder of said semiconductor power device melts due to the heat generation of said semiconductor power device, further comprising at least one stopper member associated with said circuit board for stopping the falling of said semiconductor power device;

wherein, in a condition when said semiconductor power device is stopped by said stopper member, said semiconductor power device becomes in an electrically open state and said semiconductor power device is retained at the stopped position in consequence of the subsequent cooling of the solder.

2. An electric circuit apparatus, comprising:

a circuit board;

at least one semiconductor power device of surface-mounting type mounted on said circuit board by soldering;

a retention member for slantingly retaining said circuit board so that said semiconductor power device falls out by its self-weight when the solder melts due to the heat generation of said semiconductor power device; and at least one stopper member associated with said circuit board for stopping the falling of said semiconductor power device;

wherein, in a condition when said semiconductor power device is stopped by said stopper member, said semiconductor power device becomes in an electrically open state and said semiconductor power device is retained at the stopped position in consequence of the subsequent cooling of the solder.

3. An electric circuit apparatus according to claim 2, wherein said retention member and said stopper members are fabricated as a single integrated unit.

4. An electric circuit apparatus according to claim 2, wherein said semiconductor power device is mounted on said circuit board by soldering of the back electrode of said semiconductor power device to a first electrode pad formed on said circuit board and, in a condition when said semiconductor power device is stopped by said stopper members, said back electrode of said semiconductor power device is fixed partially to said first electrode pad.

5. An electric circuit apparatus according to claim 4, wherein other electrode terminal of said semiconductor power device is soldered to a second electrode pad located at the opposite side of said stopper member with respect to said first electrode pad in an inclination direction of said circuit board.

6. An electric circuit apparatus according to claim 2, wherein a plurality of said semiconductor power devices are mounted on said circuit board and a plurality of said stopper members are provided to stop the falling of the respective semiconductor power devices.

7. An electric circuit apparatus according to claim 2, wherein a plurality of said semiconductor power devices are mounted on said circuit board and the falling of each of said semiconductor power devices is intended to be stopped by said stopper member.

8. An electric circuit apparatus according to claim 7, further comprising other circuit elements than said plurality of semiconductor power devices which are positioned at a higher location than said plurality of semiconductor power devices in an inclination direction of said circuit board.

* * * * *